United States Patent
Kosaki et al.

(10) Patent No.: US 7,554,132 B2
(45) Date of Patent: Jun. 30, 2009

(54) ELECTRONIC DEVICE CONTAINING GROUP-III ELEMENT BASED NITRIDE SEMICONDUCTORS

(75) Inventors: Masayoshi Kosaki, Aichi-ken (JP); Koji Hirata, Aichi-ken (JP)

(73) Assignee: Toyoda Gosei, Co., Ltd., Nishikasugai-gun, Aichi (JP)

( * ) Notice: Subject to any disclaimer, the term of this patent is extended or adjusted under 35 U.S.C. 154(b) by 475 days.

(21) Appl. No.: 11/523,740

(22) Filed: Sep. 20, 2006

(65) Prior Publication Data
US 2007/0069239 A1 Mar. 29, 2007

(30) Foreign Application Priority Data
Sep. 27, 2005 (JP) ............................. 2005-280743
Jun. 19, 2006 (JP) ............................. 2006-168795

(51) Int. Cl.
*H01L 31/072* (2006.01)
(52) U.S. Cl. ................ 257/190; 257/103; 257/E33.028
(58) Field of Classification Search ............. 257/12–14, 257/79, 94, 96, 97, 103, 190, 613, 615, E33.008, 257/E33.028
See application file for complete search history.

(56) References Cited

U.S. PATENT DOCUMENTS 5,276,340 A * 1/1994 Yokoyama et al. .......... 257/194

2002/0096683 A1 7/2002 Ramadani et al.
2005/0051804 A1 3/2005 Yoshida

FOREIGN PATENT DOCUMENTS

| JP | 8-203834 | 8/1996 |
| JP | 2002-359255 | 12/2002 |
| WO | WO99/59195 | 11/1999 |
| WO | WO00/25353 | 5/2000 |

OTHER PUBLICATIONS

German Office Action dated Mar. 31, 2008, with an English translation.
Chinese Office Action dated May 9, 2008, with an English translation.

* cited by examiner

*Primary Examiner*—David Vu
(74) *Attorney, Agent, or Firm*—McGinn IP Law Group, PLLC

(57) ABSTRACT

An electronic device includes a substrate; a single-crystalline first buffer layer, disposed on the substrate, containing a semiconductor represented by the formula $Al_xGa_{1-x}N$; a non-single-crystalline second buffer layer, disposed on the first buffer layer, containing a semiconductor represented by the formula $Al_yGa_{1-y}N$; and an undoped base layer, disposed on the second buffer layer, containing GaN, wherein $0<x\leq1$ and $0\leq y\leq1$. The first buffer layer is formed at a temperature of 1000° C. to 1200° C. The second buffer layer is formed at a temperature of 350° C. to 800° C. The substrate contains SiC. The second buffer layer has a thickness of 5 to 20 nm.

12 Claims, 3 Drawing Sheets

[Fig. 1]
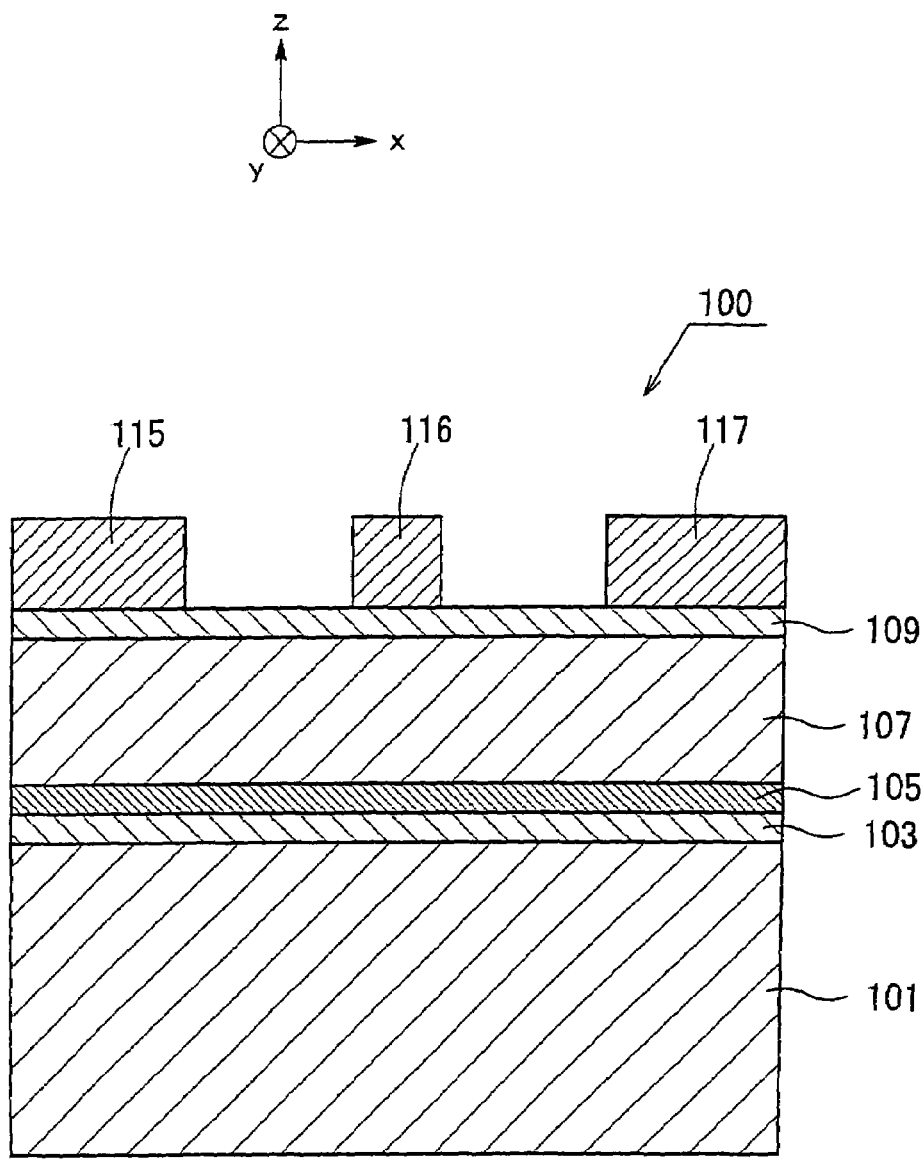

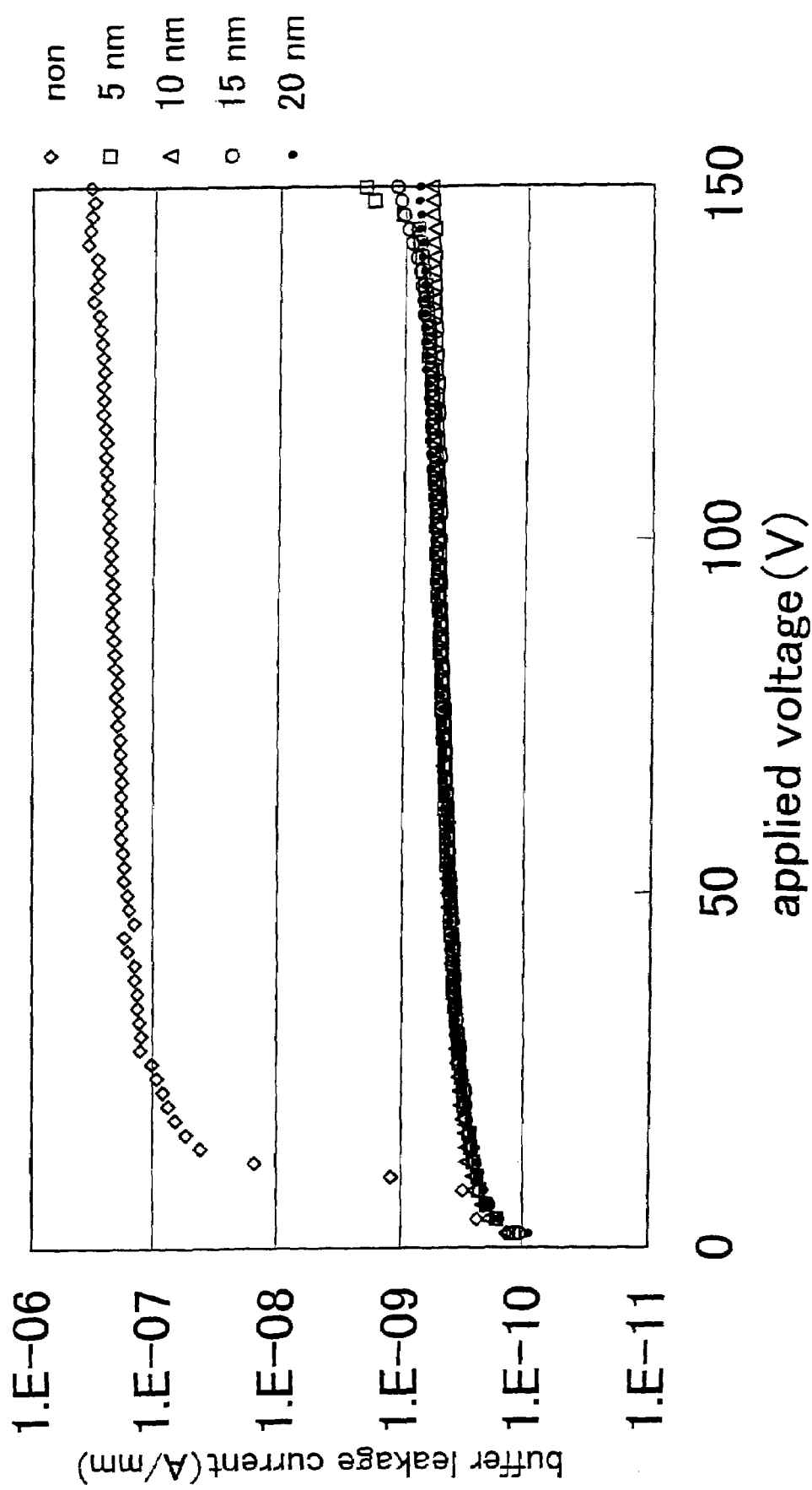

[Fig.3]
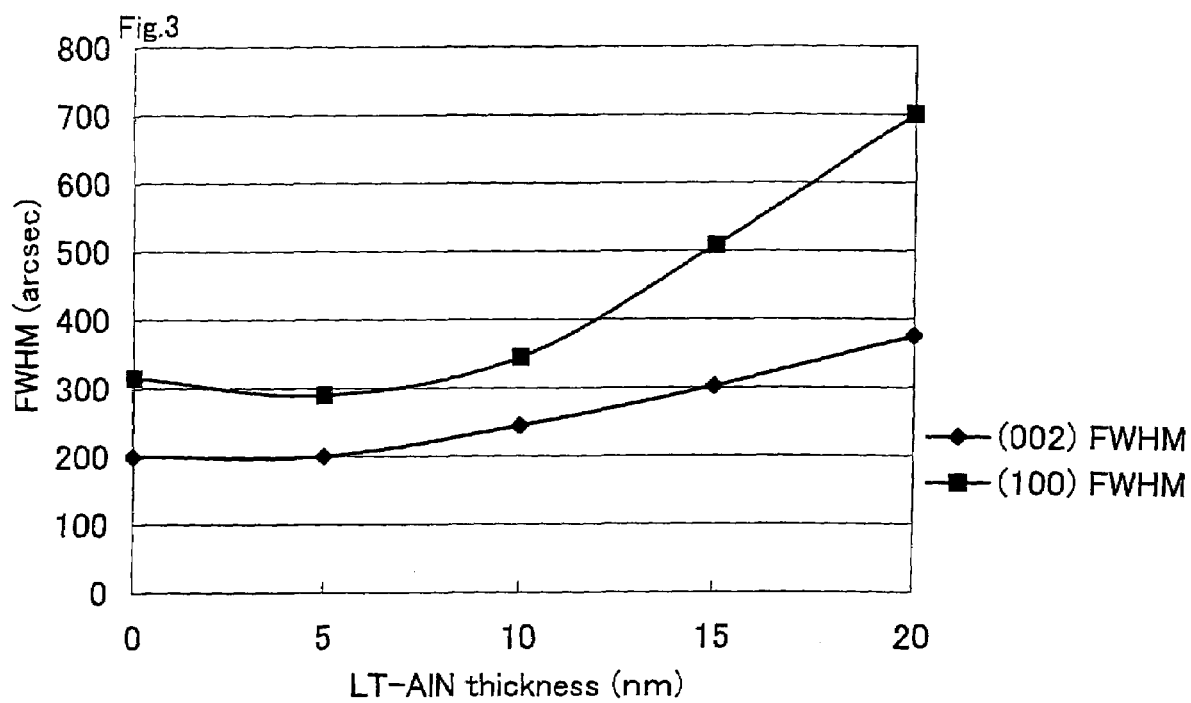

ELECTRONIC DEVICE CONTAINING GROUP-III ELEMENT BASED NITRIDE SEMICONDUCTORS

BACKGROUND OF THE INVENTION

1. Field of the Invention

The present invention relates to electronic devices such as light-emitting diodes and field-effect transistors (FETs) including high-electron-mobility transistors (HEMTs). The present invention particularly relates to an electronic device containing group-III element nitride semiconductors.

2. Description of the Related Art

Japanese Unexamined Patent Application Publication No. 2002-359255 (hereinafter referred to as Patent Document 1) discloses a technique that a base layer, containing a nitride semiconductor containing aluminum (Al), having a thickness of 0.5 to 100 µm is formed on a conductive silicon carbide (SiC) substrate at a temperature of 1100° C. to 1250° C., an undoped gallium nitride (GaN) layer is formed on the base layer, and a nitride semiconductor layer is formed on the GaN layer. In the technique, the base layer is used to insulate the substrate. The base layer most preferably comprises aluminum nitride (AlN) which has a wide bandgap and which is insulative.

In conventional techniques, base layers and/or GaN layers disposed on the base layers are doped with a transition metal, such as iron (Fe), for forming a deep impurity level, or doped with carbon (C) in some cases such that these layers are rendered insulative.

In the technique disclosed in Patent Document 1, there is a problem in that although the device is insulated from the substrate, when the base layer is made of the nitride semiconductor having Al as an essential element, an electronic device prepared by the technique has low dielectric strength and a leakage current flows between an input and an output terminal when the electronic device is out of conduction or is turned off. In the conventional techniques, there is a problem in that device properties are deteriorated due to factors below.

(1) While crystals in undoped layers are being grown or after the crystals are grown, the dopant (for example, the transition metal) migrates to undoped layers; hence, the crystallinity of the undoped layers and that of semiconductor layers disposed on or above the undoped layers are deteriorated.

(2) If the dopant (for example, the transition metal) is transported to regions by thermal diffusion or the like, located near heterojunction for forming two-dimensional electron gas layers, the resulting dopant causes electron scattering in areas on channels, thereby increasing the on-resistance of electronic devices including the layers containing the dopant.

SUMMARY OF THE INVENTION

The present invention has been made to solve the above problems. It is an object of the present invention to provide an electronic device having high dielectric strength due to a reduction in leakage current.

In order to solve the above problems, a device below is useful.

The present invention provides an electronic device prepared by forming a plurality of semiconductor crystal layers comprising group-III element nitride based semiconductors by crystal growth. The electronic device comprises a substrate; a single-crystalline first buffer layer, disposed on the substrate, comprising a semiconductor represented by the formula $Al_xGa_{1-x}N$; a non-single-crystalline second buffer layer, disposed on the first buffer layer, comprising a semiconductor represented by the formula $Al_yGa_{1-y}N$; and an undoped base layer, disposed on the second buffer layer, comprising GaN, wherein $0<x\leq1$ and $0\leq y\leq1$.

The base layer is defined as a layer disposed on the second buffer layer and used to enhance the crystallinity of a layer, disposed on the base layer, functioning as a device. Layers functioning as devices may be arranged on the base layer or the base layer may function as a device. The first buffer layer is made of a single-crystalline semiconductor. The substrate is not particularly limited and may contain SiC or may be made of sapphire. When the first buffer layer comprises $Al_xGa_{1-x}N$ ($0<x\leq1$) and has a large thickness, especially in case of using AlN, the first buffer layer has high insulating properties; hence, a conductive substrate such as a Si substrate or an n-type SiC substrate may be used.

The first buffer layer preferably has a thickness of 100 nm to 20 µm and more preferably 150 nm to 15 µm. The first buffer layer, however, is not particularly limited in thickness, any thickness may be used such that first buffer layer can have high crystallinity.

The non-single-crystalline of the second buffer layer involves amorphous or polycrystalline. Examples of the second buffer layer include polycrystalline semiconductor layers obtained in such a manner that amorphous semiconductor layers are formed at low temperature by crystal growth and then polycrystallized at an elevated temperature. Therefore, the second buffer layer may be formed in the same manner as that for forming an ordinary low-temperature growth buffer layer used to grow GaN crystals on a sapphire or SiC substrate.

In the electronic device, the first buffer layer is preferably formed at a temperature of 1000° C. to 1200° C. The first buffer layer is usually formed in such a manner that a single crystal of a semiconductor having the same composition as that of the first buffer layer is grown at high temperature.

The second buffer layer is preferably formed at a temperature of 350° C. to 800° C., more preferably 400° C. to 750° C., and further more preferably 400° C. to 600° C. In order to allow the second buffer layer to be non-single-crystalline, the second buffer layer is preferably formed at such a temperature. If the second buffer layer obtained is non-single-crystalline, the second buffer layer may be formed by a high-temperature growth process or a sputtering process.

The second buffer layer preferably has a thickness of 5 to 20 nm.

Advantages of the present invention are as described below.

In the electronic device, the second buffer layer, which is non-single-crystalline ($Al_yGa_{1-y}N$; $0\leq y\leq1$), is disposed between the first buffer layer and the base layer; hence, a leakage path through which a leakage current flows is probably prevented from being formed between the first buffer layer and the base layer although leakage paths are probably present between buffer layers and base layers included in conventional electronic devices. Alternatively, the presence of the second buffer layer probably leads to an effective increase in the sheet resistance of such a leakage path. This allows the electronic device to have high dielectric strength due to a reduction in leakage current. The leakage current is hereinafter referred to as a buffer leakage current in some cases.

If the first buffer layer is formed at a temperature of 1000° C. to 1200° C., the first buffer layer can be single-crystallized.

If the second buffer layer is formed at a temperature of 350° C. to 800° C., the second buffer layer can be prevented from being single-crystallized and can be non-single crystal.

If the substrate contains SiC, the base layer can have high crystallinity because GaN comprised in the base layer has a lattice constant close to that of SiC.

If the second buffer layer has a thickness of 5 to 20 nm, undesirable side-effects can be prevented. If the second buffer layer has an extremely small thickness, the thickness of the second buffer layer cannot be precisely controlled and is therefore nonuniform. In contrast, if the second buffer layer has an extremely large thickness, the high crystallinity of the first buffer layer cannot be exerted on the base layer and the second buffer layer has poor flatness; hence, the base layer has low crystallinity and/or poor flatness. This is not preferable.

BRIEF DESCRIPTION OF THE DRAWINGS

FIG. 1 is a sectional view of a field-effect transistor that is an example of an electronic device according to a first embodiment of the present invention;

FIG. 2 is a graph showing the relationship between the voltage applied between a source electrode and drain electrode included in each sample and the corresponding buffer leakage current; and FIG. 3 is a graph showing the relationship between the thickness of a second buffer layer included in each sample and the half-width of the X-ray rocking curve of the sample.

DESCRIPTION OF THE PREFERRED EMBODIMENTS

Embodiments of the present invention will now be described in detail. The embodiments should not, in any way, be construed as limitative.

The substrate preferably contains SiC. SiC is incompatible with GaN. Therefore, if the substrate contains SiC, the first buffer layer disposed on the substrate preferably comprises $Al_xGa_{1-x}N$ ($0<x\leq1$) essentially having Al, most preferably AlN. It is more preferable that the first and second buffer layers both comprise AlN.

FIRST EXAMPLE

FIG. 1 shows a field-effect transistor 100 that is an example of an electronic device according to a first embodiment of the present invention. The field-effect transistor 100 is a semiconductor device prepared by depositing group-III element nitride based semiconductors. With reference to FIG. 1, the field-effect transistor 100 includes a crystal growth substrate 101, a first buffer layer 103, a second buffer layer 105, an undoped first semiconductor crystal layer 107, and a doped second semiconductor crystal layer 109, these layers being arranged on the crystal growth substrate 101 in that order. The crystal growth substrate 101 has a thickness of about 400 μm and comprises SiC. The first buffer layer 103 has a thickness of about 200 nm and comprises AlN.

The second buffer layer 105 has a thickness of about 10 nm and comprises AlN. As described below in detail, it has been confirmed that the present device has good properties when the thickness of the second buffer layer 105 is between 5 to 20 nm.

The first semiconductor crystal layer 107 has a thickness of about 2 μm and comprises undoped GaN. The second semiconductor crystal layer 109 has a thickness of about 45 nm and comprises an undoped semiconductor represented by the formula $Al_{0.2}Ga_{0.8}N$. The second semiconductor crystal layer 109 serves as a carrier supply layer. The second semiconductor crystal layer 109 may comprise a semiconductor represented by the formula $Al_zGa_{1-z}N$, wherein $0.15\leq z\leq0.20$.

When a gate is turned on, a two-dimensional electron gas layer is created above the heterointerface between the first and second semiconductor crystal layers 107 and 109. The thickness (about 45 nm) of the second semiconductor crystal layer 109 is sufficiently small to allow electrons to tunnel from ohmic electrodes described below to the two-dimensional electron gas layer.

The field-effect transistor 100 further includes a source electrode 115 that is ohmic, a gate electrode 116 that is a Schottky type, and a drain electrode 117 that is ohmic, these electrodes being arranged on the second semiconductor crystal layer 109. The source and drain electrodes 115 and 117 each include a first metal layer formed by vapor deposition and a second metal layer, formed by vapor deposition, lying on the first metal layer. The first metal layer comprises titanium (Ti) and has a thickness of about 10 nm. The second metal layer comprises Al and has a thickness of about 300 nm. The source and drain electrodes 115 and 117 are securely bonded to or alloyed with the second semiconductor crystal layer 109 lying thereunder in such a manner that the source and drain electrodes 115 and 117 are heat-treated at a temperature of about 700° C. to 900° C. for less than one second by flash annealing. The gate electrode 116 includes a third metal layer and a fourth metal layer disposed thereon. The third metal layer contains nickel (Ni) and has a thickness of about 10 nm. The fourth metal layer contains gold (Au) and has a thickness of about 300 nm.

A method for manufacturing the field-effect transistor 100 will now be described.

The first and second buffer layers 103 and 105 and the first and second semiconductor crystal layers 107 and 109 are preferably formed by a vapor-phase growth technique such as metal-organic vapor phase epitaxy (MOVPE). Gaseous source used to form these layers are gaseous hydrogen ($H_2$) or nitrogen ($N_2$) used as a carrier gas, gaseous ammonia ($NH_3$), gaseous trimethyl gallium ($Ga(CH_3)_3$), gaseous trimethyl aluminum ($Al(CH_3)_3$), and the like.

Examples of a technique for forming these layers include molecular beam epitaxy (MBE) and halide vapor phase epitaxy (HVPE) in addition to MOVPE.

Conditions for forming these layers are as described below.

1. First Buffer Layer 103
(1) Crystal Growth Temperature To: 1,140° C.
(2) Layer Structure: Single-Layer Structure (about 200 nm thickness, AlN)

2. Second Buffer Layer 105
(1) Crystal Growth Temperature $T_o$: 400° C.
(2) Layer Structure: Single-Layer Structure (about 10 nm thickness, AlN)

3. First Semiconductor Crystal Layer 107
(1) Crystal Growth Temperature $T_A$: 1,150° C.
(2) Layer Structure: Single-Layer Structure (about 2 μm thickness, undoped GaN)

4. Second Semiconductor Crystal Layer 109
(1) Crystal Growth Temperature $T_B$: 1,000° C.
(2) Layer Structure: Single-Layer Structure (about 45 nm thickness, undoped $Al_{0.2}Ga_{0.8}N$)

Under the above conditions, the layers included in the field-effect transistor 100 shown in FIG. 1 can be formed.

Experiment 1

A first sample, a second sample, a third sample, and a fourth sample and a comparative sample were prepared. The first to fourth samples had substantially the same configuration as that of the field-effect transistor 100 shown in FIG. 1 except that the second semiconductor crystal layer 109 was not formed. In those samples the source and drain ohmic electrodes 115 and 117 were directly arranged on the first semiconductor crystal layer 107 and the gate electrode was not formed. Accordingly, a channel, that is, a two-dimensional electron gas layer can be unconditionally prevented from being formed on the first semiconductor crystal layer 107 without applying a gate voltage; hence, the leakage current does not depend on conditions for forming any second semiconductor crystal layer 109 and the gate voltage. These samples can be realized off-state without forming a depletion layer by applying a gate voltage. Accordingly a precise measurement of the leakage current of the HEMT of FIG. 1 can be realized. The first sample comprised a second buffer layer 105 with a thickness of 5 nm, the second sample comprised a second buffer layer 105 with a thickness of 10 nm, the third sample comprised a second buffer layer 105 with a thickness of 15 nm, the fourth sample comprised a second buffer layer 105 with a thickness of 20 nm, and the fifth sample as the comparative sample did not comprised a second buffer layer 105.

The first to fifth samples were measured for leakage current in such a manner that a voltage was applied between the source and drain electrodes of each sample. The electrodes and layers of the first to fifth samples had the same length in the y-axis direction in FIG. 1.

FIG. 2 shows the relationship between the voltage applied between the source and drain electrodes of each sample and the corresponding buffer leakage current. In FIG. 2, the horizontal axis represents the voltage applied between the source and the drain electrodes and the vertical axis represents the corresponding buffer leakage current per unit length in the y-axis direction in FIG. 1. In FIG. 2, square dots (□), triangular dots (Δ), unfilled circular dots (○), filled circular dots (•), and rhombic dots (◇) represent the buffer leakage currents flowing in the first sample, the second sample, the third sample, the fourth sample, and the fifth sample, respectively.

As is clear from FIG. 2, in the voltage range from 25 to 140 V, it is understood that the buffer leakage currents at off-state flowing in the example HEMT (the field-effect transition 100) of the present invention are very small and about 0.2% to 0.3% of those flowing in conventional field-effect transistors. Furthermore, the buffer leakage currents is in the first to fourth samples only slightly vary depending on the voltages applied between the source and drain electrodes of the first to fourth samples. In contrast, the buffer leakage current in the fifth sample, prepared as the comparative example, including no second buffer layer is large and seriously varies depending on the voltage applied between the source and drain electrodes of the fifth sample.

And it is understood that the buffer leakage current varies in each chip when the second buffer layer is not formed but the buffer leakage current does not varies in each chip when the second buffer layer is formed.

This experiment shows that the buffer leakage current flowing in a field-effect transistor can be greatly reduced by appropriately controlling the thickness of a second buffer layer included in this field-effect transistor, whereby the dielectric strength of this field-effect transistor can be enhanced.

Experiment 2

The first to fifth samples were analyzed by X-ray diffractometry. In particular, the (002) plane and (100) plane of the first semiconductor crystal layer 107 after forming in 2 μm thickness included in each of the first to fifth samples were checked.

FIG. 3 shows the relationship between the thickness of the second buffer layer 105 included in each of the first to fifth samples and the half-width (FWHM) of the X-ray rocking curve of each sample.

In FIG. 3, the horizontal axis represents the thickness of the second buffer layer 105 and the vertical axis represents the half-width of the X-ray rocky curve.

As is clear from FIG. 3, the first semiconductor crystal layers 107 of the first sample including the second buffer layers 105 in thickness of 5 nm is not greatly different in crystallinity from the first semiconductor crystal layer 107 of the fifth sample including no second buffer layer 105 although the first sample are greatly different in buffer leakage current from the fifth sample as shown in FIG. 2. This shows that there is no direct relationship between the reduction of the leakage current by the second buffer layers 105 and the crystallinity of the first semiconductor crystal layers 107, which serve as base layers.

OTHER EMBODIMENTS

The type of a substrate used herein is not particularly limited. If, for example, an insulating substrate is used, a first buffer layer disposed thereon may have a small thickness in view of insulation. Alternatively, the following substrate may be used: a template substrate prepared in such a manner that a single-crystalline AlN layer, corresponding to the first buffer layer 103 described in the first embodiment, having a thickness of 10 μm is formed on an n-type SiC substrate by HVPE. The template substrate preferably has a non-single-crystalline second buffer layer formed thereon at low temperature. Alternatively, a template substrate prepared by forming a single-crystalline AlN or AlGaN layer corresponding to the first buffer layer 103 on a sapphire substrate may be used. This template substrate preferably has a non-single-crystalline second buffer layer formed thereon at low temperature.

In the first embodiment, the first and second buffer layers 103 and 105 both contain AlN. The first buffer layer 103 may comprise a group-III element nitride based semiconductor essentially comprising Al. The second buffer layer 105 may comprise another group-III element nitride based semiconductor which need not necessarily comprise Al and of which the composition is arbitrary.

An electronic device according to the present invention has high dielectric strength due to a reduction in leakage current and therefore is suitable for use in an electron apparatus such as a high-voltage operational amplifier or a high-voltage, high-frequency electronic apparatus used in a base station for mobile phones.

What is claimed is:

1. An electronic device prepared by forming a plurality of semiconductor crystal layers containing group-III element nitride based semiconductors by crystal growth, the electronic device comprising:
    a substrate;
    a single-crystalline first buffer layer, disposed on the substrate, comprising a semiconductor represented by the formula $Al_xGa_{1-x}N$ ($0<x\leq1$);
    a non-single-crystalline second buffer layer, disposed on the first buffer layer, comprising a semiconductor represented by the formula $Al_yGa_{1-y}N$ ($0\leq y\leq1$); and
    an undoped base layer, disposed on the second buffer layer, containing GaN.

2. The electronic device according to claim 1, wherein the first buffer layer is formed at a temperature of 1000° C. to 1200° C.

3. The electronic device according to claim 2, wherein the second buffer layer is formed at a temperature of 350° C. to 800° C.

4. The electronic device according to claim 3, wherein the second buffer layer has a thickness of 5 to 20 nm.

5. The electronic device according to claim 2, wherein the substrate contains SiC.

6. The electronic device according to claim 2, wherein the second buffer layer has a thickness of 5 to 20 nm.

7. The electronic device according to claim 1, wherein the second buffer layer is formed at a temperature of 350° C. to 800° C.

8. The electronic device according to claim 7, wherein the substrate contains SiC.

9. The electronic device according to claim 7, wherein the second buffer layer has a thickness of 5 to 20 nm.

10. The electronic device according to claim 1, wherein the substrate contains SiC.

11. The electronic device according to claim 10, wherein the second buffer layer has a thickness of 5 to 20 nm.

12. The electronic device according to claim 1, wherein the second buffer layer has a thickness of 5 to 20 nm.

* * * * *